United States Patent
Johnson et al.

(10) Patent No.: US 9,823,573 B2
(45) Date of Patent: Nov. 21, 2017

(54) CORRECTION OF NON-UNIFORM PATTERNS USING TIME-SHIFTED EXPOSURES

(71) Applicant: Applied Materials, Inc., Santa Clara, CA (US)

(72) Inventors: Joseph R. Johnson, Redwood City, CA (US); Christopher Dennis Bencher, Cupertino, CA (US); Thomas L. Laidig, Richmond, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/188,667

(22) Filed: Jun. 21, 2016

(65) Prior Publication Data

US 2017/0003598 A1   Jan. 5, 2017

Related U.S. Application Data

(60) Provisional application No. 61/188,303, filed on Jul. 2, 2015.

(51) Int. Cl.
  *G03F 7/20* (2006.01)

(52) U.S. Cl.
  CPC ...... *G03F 7/70041* (2013.01); *G03F 7/70291* (2013.01); *G03F 7/70583* (2013.01)

(58) Field of Classification Search
  None
  See application file for complete search history.

(56) References Cited

U.S. PATENT DOCUMENTS

| | | | |
|---|---|---|---|
| 6,238,852 B1 | 5/2001 | Klosner | |
| 2005/0041229 A1 | 2/2005 | Meisburger | |
| 2009/0053618 A1 | 2/2009 | Goehnermeier | |
| 2013/0105807 A1 | 5/2013 | Im et al. | |
| 2014/0078567 A1 | 3/2014 | Bleidistel et al. | |
| 2014/0368803 A1* | 12/2014 | Patra | G02B 27/0927 355/67 |

OTHER PUBLICATIONS

International Search Report and Written Opinion in related case PCT/US2016/038471 dated Sep. 12, 2016.

* cited by examiner

*Primary Examiner* — Steven H Whitesell Gordon
(74) *Attorney, Agent, or Firm* — Patterson + Sheridan LLP

(57) ABSTRACT

An image correction application relating to the ability to apply maskless lithography patterns to a substrate in a manufacturing process is disclosed. The embodiments described herein relate to a software application platform which maintains the ability to correct non-uniform image patterns using time-shifted exposures of the substrate. The application exposes subsequent portions of a substrate to electromagnetic radiation at variable and alternating pulse frequencies using a time delay in order to correct interference patterns and increase exposure uniformity.

33 Claims, 10 Drawing Sheets

1010 — EXPOSE A FIRST PORTION OF THE SUBSTRATE TO A FIRST PULSE SET OF ELECTROMAGNETIC RADIATION, WHEREIN THE FIRST PULSE SET INCLUDES A FIRST PULSE EXPOSURE AND A SECOND PULSE EXPOSURE, WHEREIN THE FIRST PULSE EXPOSURE AND THE SECOND PULSE EXPOSURE ARE SEPARATED IN TIME BY A FIRST TIME INTERVAL

1020 — EXPOSE A SECOND PORTION OF THE SUBSTRATE TO A SECOND PULSE SET OF ELECTROMAGNETIC RADIATION, WHEREIN THE SECOND PULSE SET INCLUDES A THIRD PULSE EXPOSURE AND A FOURTH PULSE EXPOSURE, WHEREIN THE THIRD PULSE EXPOSURE AND THE FOURTH PULSE EXPOSURE ARE SEPARATED IN TIME BY BETWEEN ABOUT +30% AND ABOUT -30% OF THE FIRST TIME INTERVAL, AND WHEREIN THE FIRST PULSE SET OF ELECTROMAGNETIC RADIATION AND THE SECOND PULSE SET OF ELECTROMAGNETIC RADIATION ARE SEPARATED IN TIME BY A SECOND TIME INTERVAL

*Fig. 10*

CORRECTION OF NON-UNIFORM PATTERNS USING TIME-SHIFTED EXPOSURES

CROSS-REFERENCE TO RELATED APPLICATIONS

This application claims benefit to U.S. Provisional Patent Application No. 62/188,303, filed Jul. 2, 2015, the entirety of which is hereby incorporated by reference.

BACKGROUND

Field

Embodiments of the present disclosure generally relate to the field of maskless lithography. More specifically, embodiments provided herein relate to a system and method for performing maskless digital lithography manufacturing processes.

Description of the Related Art

Photolithography is widely used in the manufacturing of semiconductor devices and display devices, such as liquid crystal displays (LCDs). Large area substrates are often utilized in the manufacture of LCDs. LCDs, or flat panels, are commonly used for active matrix displays, such as computers, touch panel devices, personal digital assistants (PDAs), cell phones, television monitors, and the like. Generally, flat panels may include a layer of liquid crystal material forming pixels sandwiched between two plates. When power from the power supply is applied across the liquid crystal material, an amount of light passing through the liquid crystal material may be controlled at pixel locations enabling images to be generated.

Microlithography techniques are generally employed to create electrical features incorporated as part of the liquid crystal material layer forming the pixels. According to this technique, a light-sensitive photoresist is typically applied to at least one surface of the substrate. Then, a pattern generator exposes selected areas of the light-sensitive photoresist as part of a pattern with light to cause chemical changes to the photoresist in the selective areas to prepare these selective areas for subsequent material removal and/or material addition processes to create the electrical features.

In order to continue to provide display devices and other devices to consumers at the prices demanded by consumers, new apparatuses, approaches, and systems are needed to precisely and cost-effectively create patterns on substrates, such as large area substrates.

As the foregoing illustrates, there is a need for an improved technique for correcting non-uniform patterns using time-shifted exposures within digital lithography. More specifically, what is needed in the art is an application which uses dual frequency pulsing to alter the frequency with which exposures are captured.

SUMMARY

The present disclosure generally relates to a software application platform which maintains the ability to correct non-uniform image patterns using time-shifted exposures of a substrate in a manufacturing process. The application exposes subsequent portions of a substrate to electromagnetic radiation at variable and alternating pulse frequencies using a time delay in order to correct interference patterns and increase exposure uniformity.

In one embodiment, a method for correcting non-uniform image patterns on a substrate is disclosed. The method may include exposing a first portion of the substrate to a first pulse set of electromagnetic radiation. The first pulse set may include a first pulse exposure and a second pulse exposure. The first pulse exposure and the second pulse exposure may be separated in time by a first time interval. The method may further include exposing a second portion of the substrate to a second pulse set of electromagnetic radiation. The second pulse set may include a third pulse exposure and a fourth pulse exposure. The third pulse exposure and the fourth pulse exposure may be separated in time by between about +30% and about −30% of the first time interval. The first pulse set of electromagnetic radiation and the second pulse set of electromagnetic radiation may be separated in time by a second time interval.

In another embodiment, a computer system for correcting non-uniform image patterns on a substrate is disclosed. The computer system may include a processor and a memory storing instructions that, when executed by the processor, cause the computer system to expose a first portion of a substrate to a first pulse set of electromagnetic radiation and expose a second portion of the substrate to a second pulse set of electromagnetic radiation. The first pulse set may include a first pulse exposure and a second pulse exposure. The first pulse exposure and the second pulse exposure may be separated in time by a first time interval. The second pulse set may include a third pulse exposure and a fourth pulse exposure. The third pulse exposure and the fourth pulse exposure may be separated in time by between about +30% and about −30% of the first time interval. The first pulse set of electromagnetic radiation and the second pulse set of electromagnetic radiation may be separated in time by a second time interval.

In yet another embodiment, a non-transitory computer-readable storage medium, storing instructions that, when executed by a processor, cause a computer system to correct non-uniform image patterns on a substrate is disclosed. The processor may perform the steps of exposing a first portion of a substrate to a first pulse set of electromagnetic radiation and exposing a second portion of the substrate to a second pulse set of electromagnetic radiation. The first pulse set may include a first pulse exposure and a second pulse exposure. The first pulse exposure and the second pulse exposure may be separated in time by a first time interval. The second pulse set may include a third pulse exposure and a fourth pulse exposure. The third pulse exposure and the fourth pulse exposure may be separated in time by between about +30% and about −30% of the first time interval. The first pulse set of electromagnetic radiation and the second pulse set of electromagnetic radiation may be separated in time by a second time interval.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of this disclosure and are therefore not to be considered limiting of its scope, for the disclosure may be applied to other equally effective embodiments.

FIG. 10 schematically illustrates operations of a method for correcting non-uniform image patterns on a substrate according to one embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to a software application platform which maintains the ability to correct non-uniform image patterns using time-shifted exposures of a substrate in a manufacturing process. The application exposes subsequent portions of a substrate to electromagnetic radiation at variable and alternating pulse frequencies using a time delay in order to correct interference patterns and increase exposure uniformity.

The term "user" as used herein includes, for example, a person or entity that owns a computing device or wireless device; a person or entity that operates or utilizes a computing device or a wireless device; or a person or entity that is otherwise associated with a computing device or a wireless device. It is contemplated that the term "user" is not intended to be limiting and may include various examples beyond those described.

Figure 1:
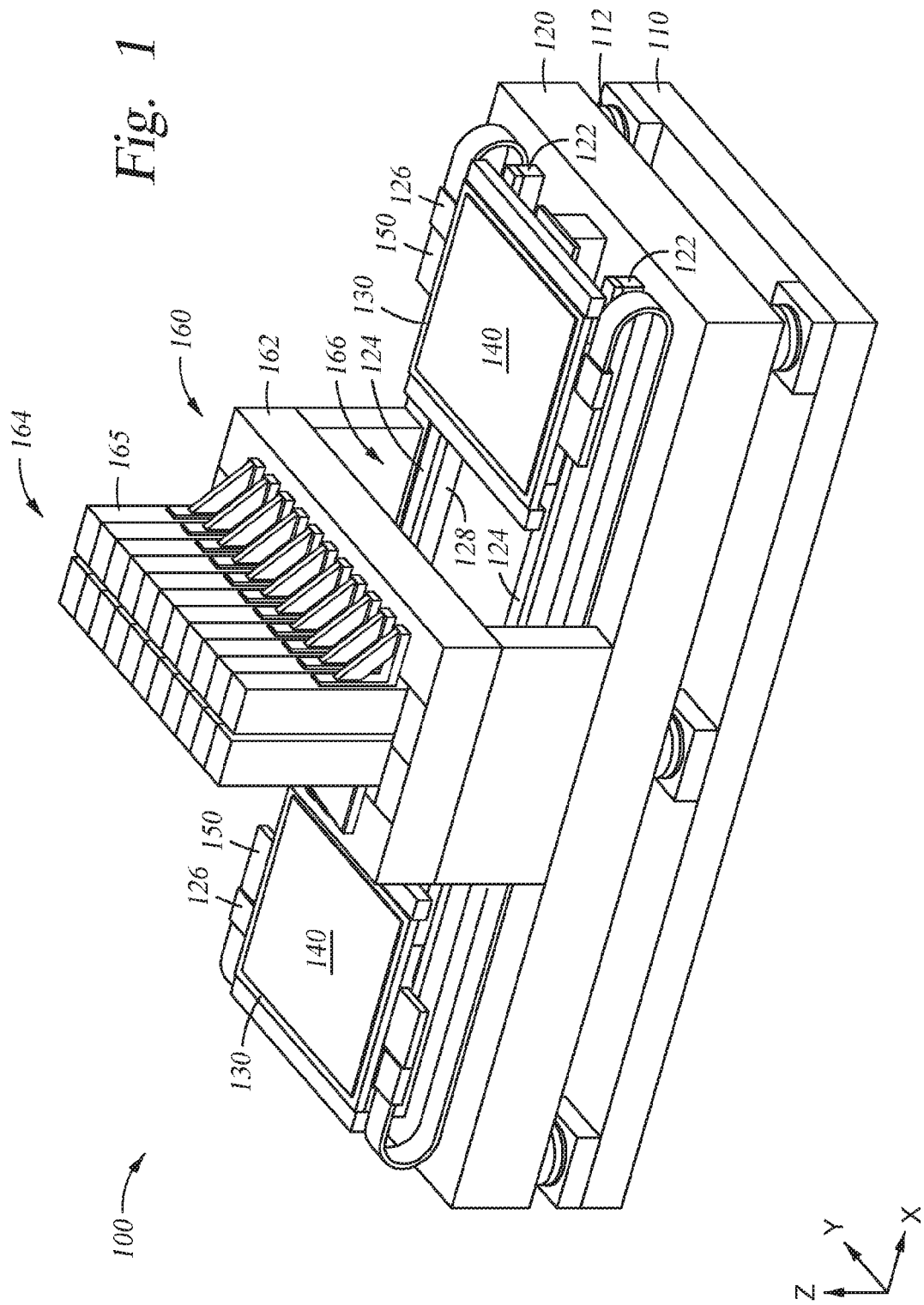
FIG. 1 is a perspective view of a system that may benefit from embodiments disclosed herein.

FIG. 1 is a perspective view of a system 100 that may benefit from embodiments disclosed herein. The system 100 includes a base frame 110, a slab 120, two or more stages 130, and a processing apparatus 160. The base frame 110 may rest on the floor of a fabrication facility and may support the slab 120. Passive air isolators 112 may be positioned between the base frame 110 and the slab 120. The slab 120 may be a monolithic piece of granite, and the two or more stages 130 may be disposed on the slab 120. A substrate 140 may be supported by each of the two or more stages 130. A plurality of holes (not shown) may be formed in the stage 130 for allowing a plurality of lift pins (not shown) to extend therethrough. The lift pins may rise to an extended position to receive the substrate 140, such as from a transfer robot (not shown). The transfer robot may position the substrate 140 on the lift pins, and the lift pins may thereafter gently lower the substrate 140 onto the stage 130.

The substrate 140 may, for example, be made of glass and be used as part of a flat panel display. In other embodiments, the substrate 140 may be made of other materials, for example, quartz. Furthermore, in other embodiments, the substrate 140 may be a polymer substrate. In some embodiments, the substrate 140 may have a photoresist layer formed thereon. A photoresist is sensitive to radiation and may be a positive photoresist or a negative photoresist, meaning that portions of the photoresist exposed to radiation will be respectively soluble or insoluble to a photoresist developer applied to the photoresist after the pattern is written into the photoresist. The chemical composition of the photoresist determines whether the photoresist will be a positive photoresist or negative photoresist. For example, the photoresist may include at least one of diazonaphthoquinone, a phenol formaldehyde resin, poly(methyl methacrylate), poly(methyl glutarimide), and SU-8. In this manner, the pattern may be created on a surface of the substrate 140 to form the electronic circuitry.

The system 100 may further include a pair of supports 122 and a pair of tracks 124. The pair of supports 122 may be disposed on the slab 120, and the slab 120 and the pair of supports 122 may be a single piece of material. The pair of tracks 124 may be supported by the pair of the supports 122, and the two or more stages 130 may move along the tracks 124 in the X-direction. In one embodiment, the pair of tracks 124 is a pair of parallel magnetic channels. As shown, each track 124 of the pair of tracks 124 is linear. In other embodiments, the track 124 may have a non-linear shape. An encoder 126 may be coupled to each stage 130 in order to provide location information to a controller 702 (See FIG. 8).

The processing apparatus 160 may include a support 162 and a processing unit 164. The support 162 may be disposed on the slab 120 and may include an opening 166 for the two or more stages 130 to pass under the processing unit 164. The processing unit 164 may be supported by the support 162. In one embodiment, the processing unit 164 is a pattern generator configured to expose a photoresist in a photolithography process. In some embodiments, the pattern generator may be configured to perform a maskless lithography process. The processing unit 164 may include a plurality of image projection systems (shown in FIG. 3) disposed in a case 165. The processing apparatus 160 may be utilized to perform maskless direct patterning. During operation, one of the two or more stages 130 moves in the X-direction from a loading position, as shown in FIG. 1, to a processing position. The processing position may refer to one or more positions of the stage 130 as the stage 130 passes under the processing unit 164. During operation, the two or more stages 130 may be lifted by a plurality of air bearings 202 (shown in FIG. 2) and may move along the pair of tracks 124 from the loading position to the processing position. A plurality of vertical guide air bearings (not shown) may be coupled to each stage 130 and positioned adjacent an inner wall 128 of each support 122 in order to stabilize the movement of the stage 130. Each of the two or more stages 130 may also move in the Y-direction by moving along a track 150 for processing and/or indexing the substrate 140.

Figure 2:
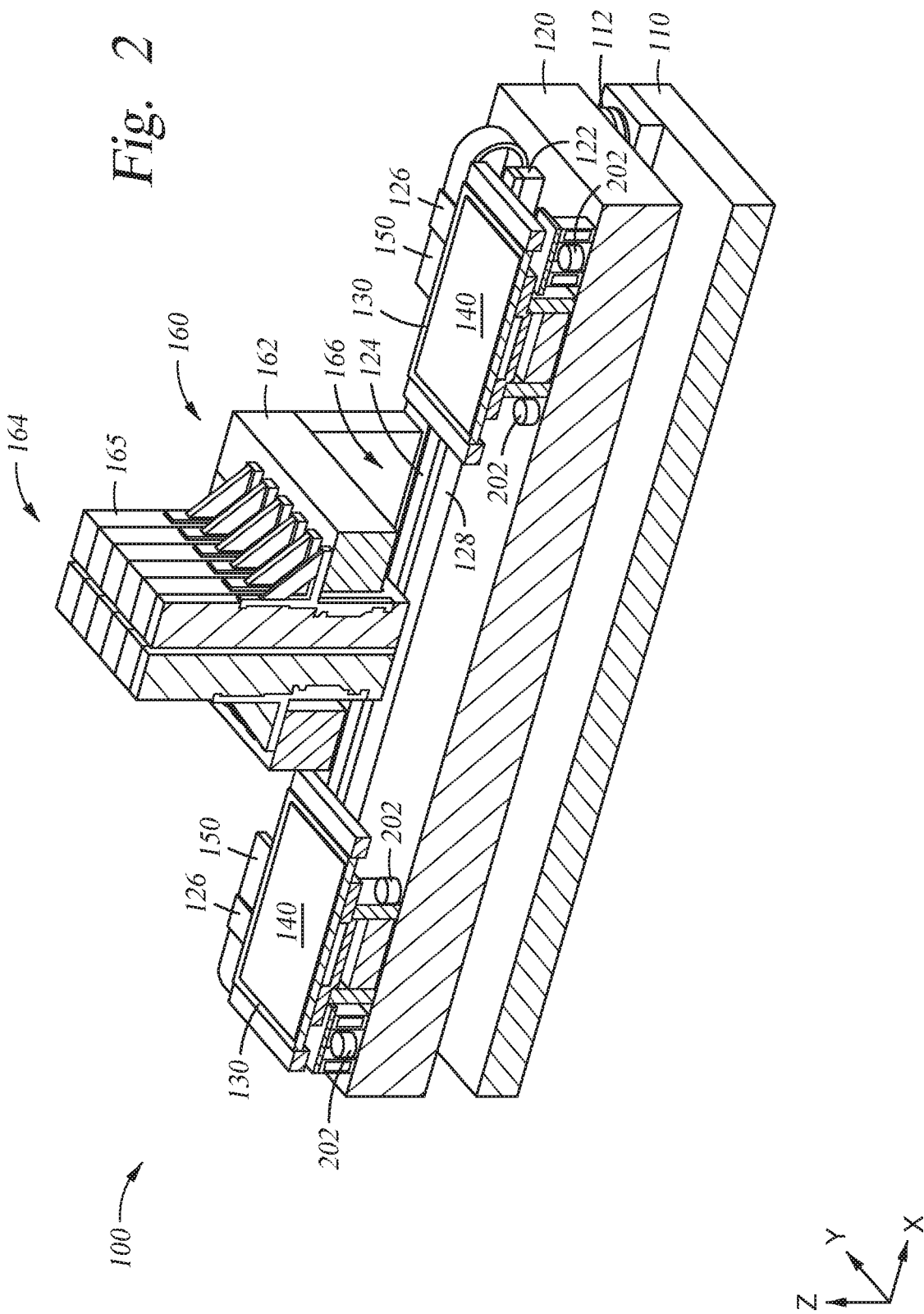
FIG. 2 is a cross-sectional side view of the system of FIG. 1 according to one embodiment.

FIG. 2 is a cross-sectional side view of the system 100 of FIG. 1 according to one embodiment. As shown, each stage 130 includes a plurality of air bearings 202 for lifting the stage 130. Each stage 130 may also include a motor coil (not shown) for moving the stage 130 along the tracks 124. The two or more stages 130 and the processing apparatus 160 may be enclosed by an enclosure (not shown) in order to provide temperature and pressure control.

Figure 3:
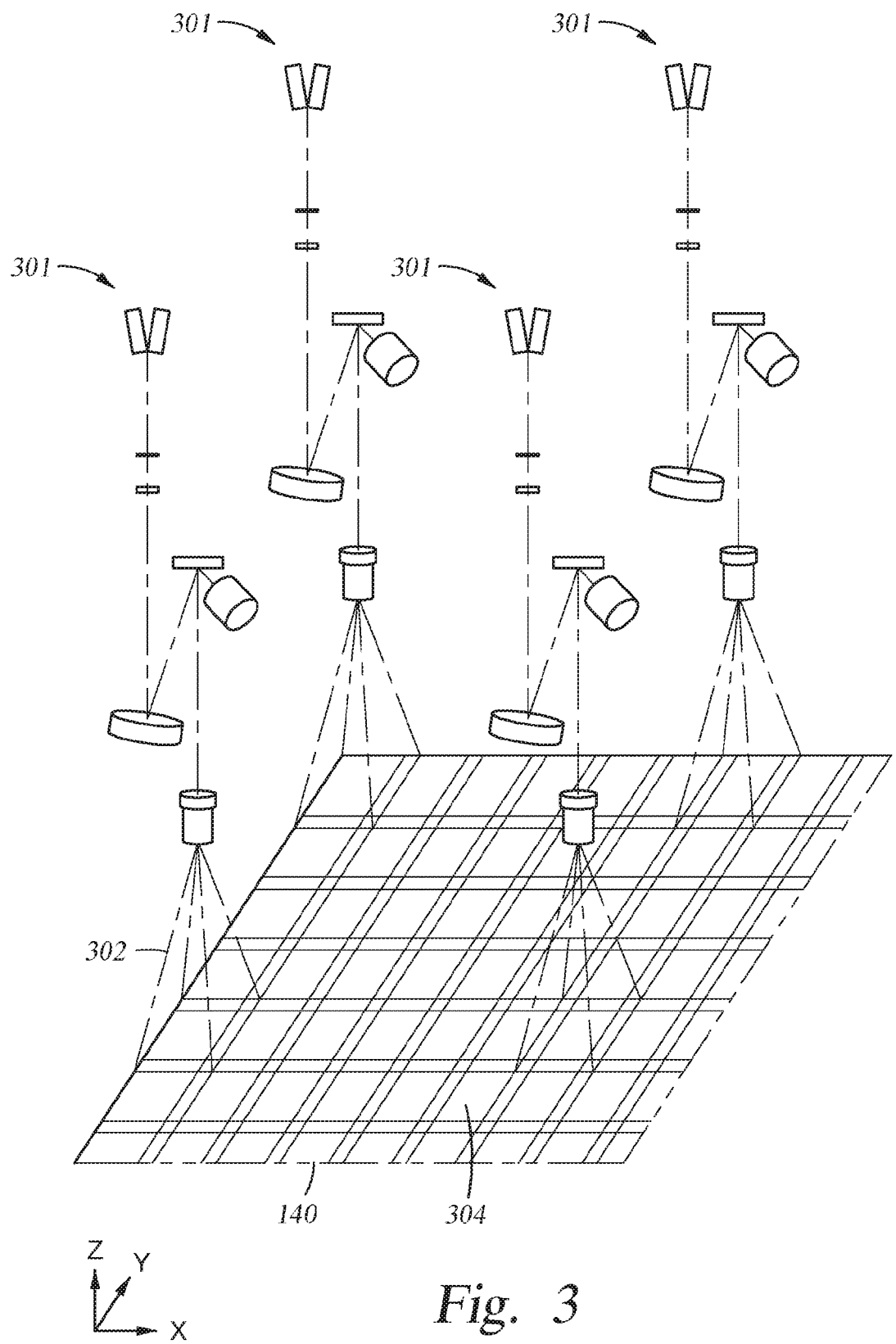
FIG. 3 is a perspective schematic view of a plurality of image projection systems according to one embodiment.

FIG. 3 is a perspective schematic view of a plurality of image projection systems 301 according to one embodiment. As shown in FIG. 3, each image projection system 301 produces a plurality of write beams 302 onto a surface 304 of the substrate 140. As the substrate 140 moves in the X-direction and Y-direction, the entire surface 304 may be patterned by the write beams 302. The number of the image projection systems 301 may vary based on the size of the substrate 140 and/or the speed of stage 130. In one embodiment, there are 22 image projection systems 164 in the processing apparatus 160.

Figure 4:
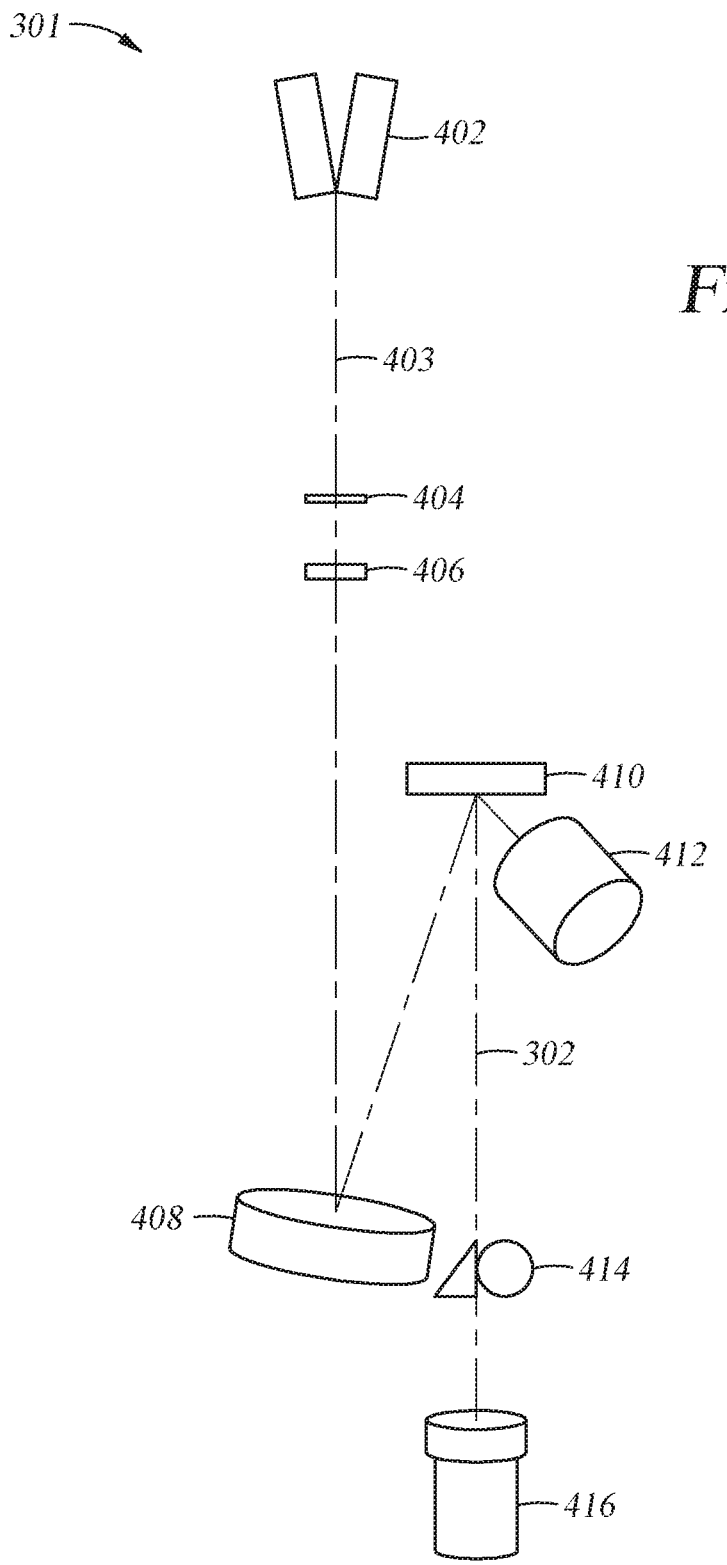
FIG. 4 is a perspective schematic view of an image projection system of the plurality of image projection devices of FIG. 3 according to one embodiment.

FIG. 4 is a perspective schematic view of one image projection system 301 of the plurality of image projection systems 301 of FIG. 3 according to one embodiment. The image projection system 301 may include a light source 402, an aperture 404, a lens 406, a mirror 408, a DMD 410, a light dump 412, a camera 414, and a projection lens 416. The light source 402 may be a light emitting diode (LED) or a laser, and the light source 402 may be capable of producing a light having predetermined wavelength. In one embodiment, the predetermined wavelength is in the blue or near ultraviolet (UV) range, such as less than about 450 nm. The mirror 408 may be a spherical mirror. The projection lens 416 may be a 10× objective lens. The DMD 410 may include a plurality of mirrors, and the number of mirrors may correspond to the resolution of the projected image. In one embodiment, the DMD 410 includes 1920×1080 mirrors, which represent the number of pixels of a high definition television or other flat panel displays.

During operation, a beam 403 having a predetermined wavelength, such as a wavelength in the blue range, is produced by the light source 402. The beam 403 is reflected to the DMD 410 by the mirror 408. The DMD 410 includes a plurality of mirrors that may be controlled individually, and each mirror of the plurality of mirrors of the DMD 410 may be at "on" position or "off" position, based on the mask data provided to the DMD 410 by the controller (not shown). When the beam 403 reaches the mirrors of the DMD 410, the mirrors that are at "on" position reflect the beam 403, i.e., forming the plurality of write beams 302, to the projection lens 416. The projection lens 416 then projects the write beams 302 to the surface 304 of the substrate 140. The mirrors that are at "off" position reflect the beam 403 to the light dump 412 instead of the surface 304 of the substrate 140.

Figure 5:
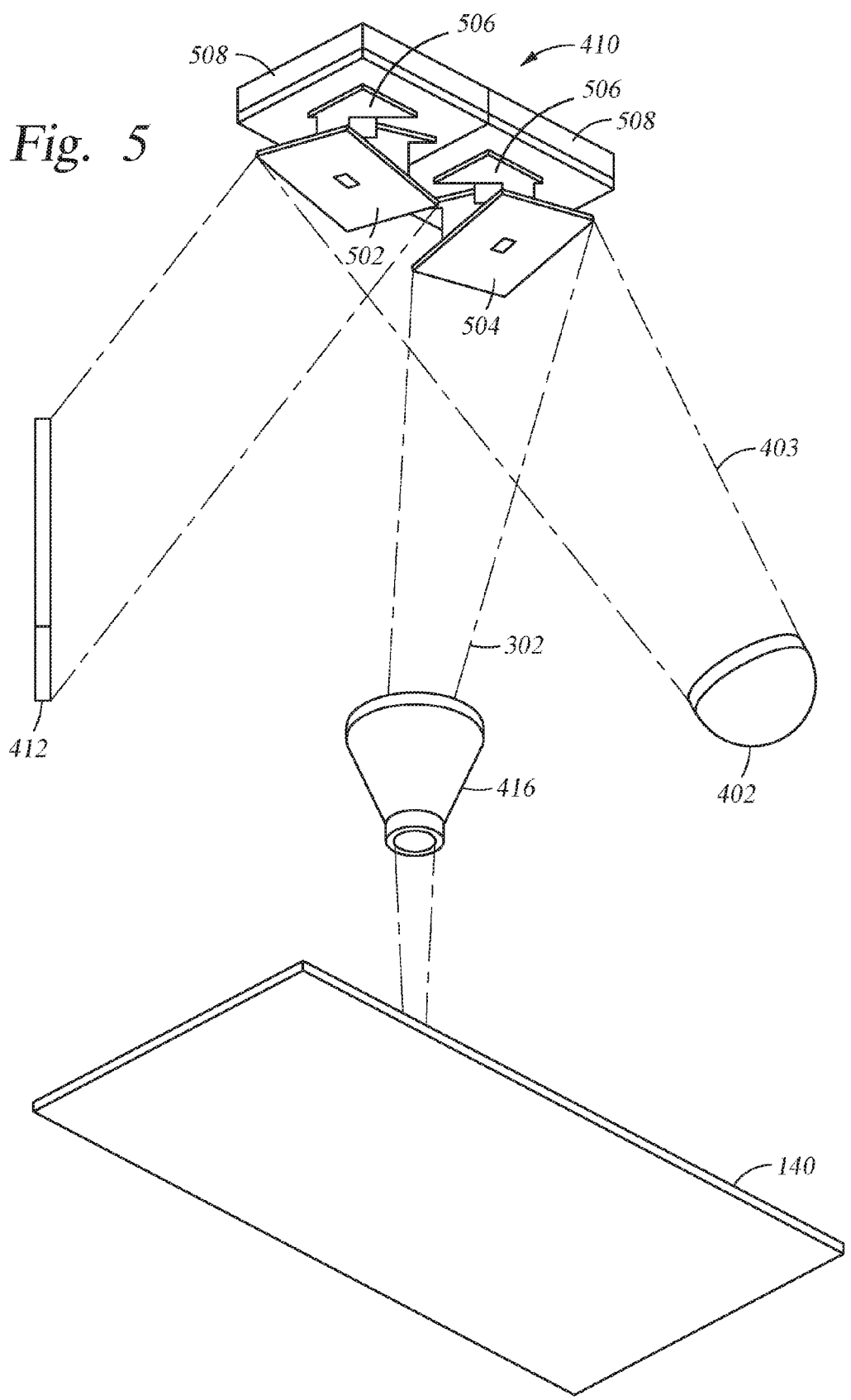
FIG. 5 schematically illustrates a beam being reflected by two mirrors of the DMD according to one embodiment.

FIG. 5 illustrates two mirrors 502, 504 of the DMD 410 according to one embodiment. As shown, each mirror 502, 504 of the DMD 410 is disposed on a tilting mechanism 506, which is disposed on a memory cell 508. The memory cell 508 may be a CMOS SRAM. During operation, each mirror 502, 504 is controlled by loading the mask data into the memory cell. The mask data electrostatically controls the tilting of the mirror 502, 504 in a binary fashion. When the mirror 502, 504 is in a reset mode or without power applied, it may be set to a flat position, not corresponding to any binary number. Zero in binary may correspond to an "off" position, which means the mirror is tilted at −10 degrees, −12 degrees, or any other feasibly negative tilting degree. One in binary may correspond to an "on" position, which means the mirror is tilted at +10 degrees, +12 degrees, or any other feasibly positive tilting degree. In some embodiments, the "on" and "off" positions may be reversed, for example, a mirror tilted at a negative tilting degree may correspond to an "on" position and/or a mirror tilted at a positive tilting degree may correspond to an "off" position. As shown in FIG. 5, the mirror 502 is at "off" position and the mirror 504 is at "on" position.

The beam 403 may be reflected by the two mirrors 502, 504 of the DMD 410, according to one embodiment. As shown, the mirror 502, which is at "off" position, reflects the beam 403 generated from the light source 402 to the light dump 412. The mirror 504, which is at "on" position, forms the write beam 302 by reflecting the beam 403 to the projection lens 416.

Figure 6:
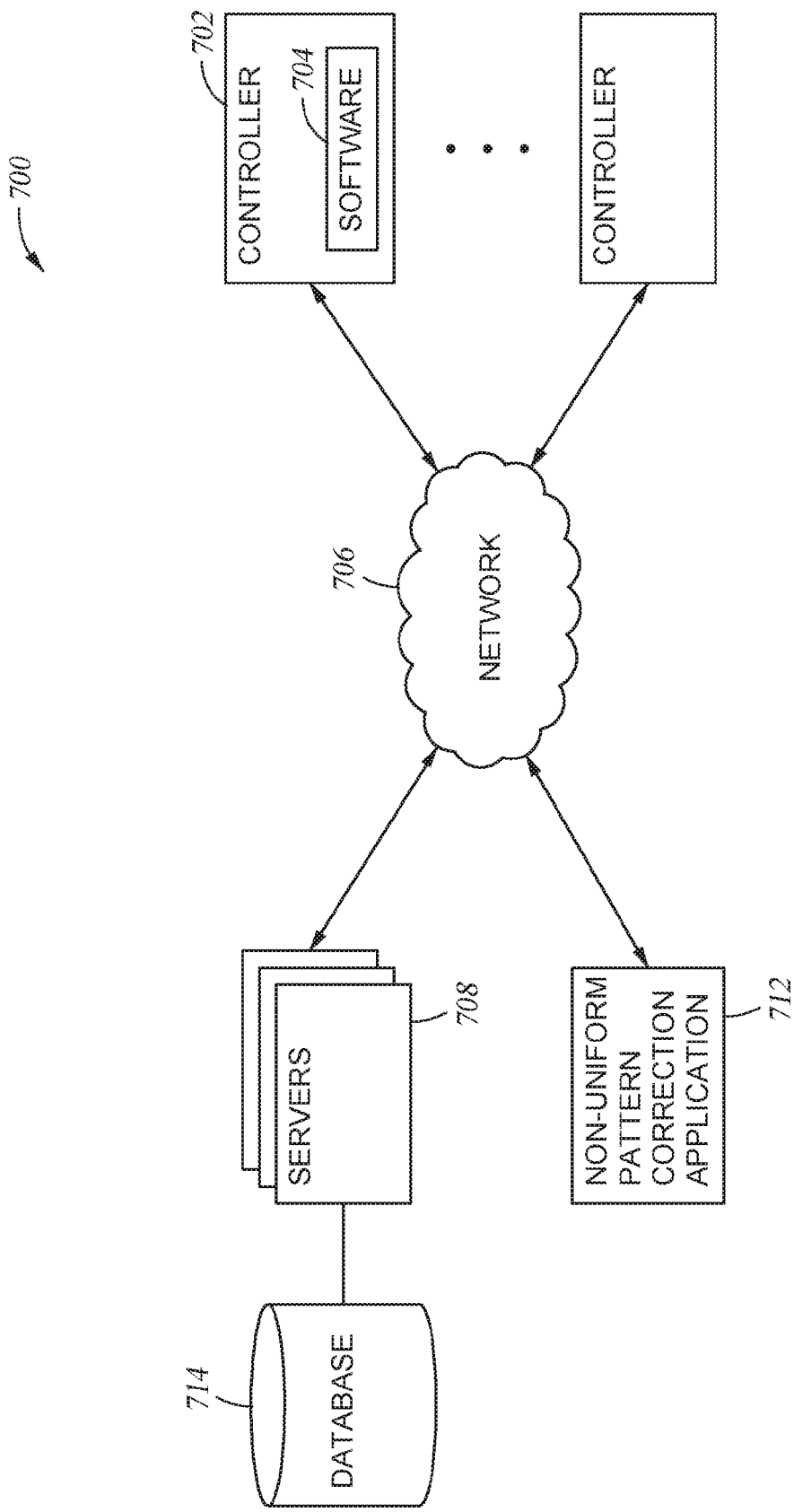
FIG. 6 illustrates a computer system for providing correction of non-uniform image patterns according to one embodiment.

FIG. 6 illustrates a computing system 700 configured for correcting non-uniform image patterns on a substrate in which embodiments of the disclosure may be practiced. As shown, the computing system 700 may include a plurality of servers 708, a non-uniform pattern correction application server 712, and a plurality of controllers (i.e., computers, personal computers, mobile/wireless devices) 702 (only two of which are shown for clarity), each connected to a communications network 706 (for example, the Internet). The servers 708 may communicate with the database 714 via a local connection (for example, a Storage Area Network (SAN) or Network Attached Storage (NAS)) or over the Internet. The servers 708 are configured to either directly access data included in the database 714 or to interface with a database manager that is configured to manage data included within the database 714.

Each controller 702 may include conventional components of a computing device, for example, a processor, system memory, a hard disk drive, a battery, input devices such as a mouse and a keyboard, and/or output devices such as a monitor or graphical user interface, and/or a combination input/output device such as a touchscreen which not only receives input but also displays output. Each server 708 and the non-uniform pattern correction application server 712 may include a processor and a system memory (not shown), and may be configured to manage content stored in database 714 using, for example, relational database software and/or a file system. The servers 708 may be programmed to communicate with one another, the controllers 702, and the non-uniform pattern correction application server 712 using a network protocol such as, for example, the TCP/IP protocol. The non-uniform pattern correction application server 712 may communicate directly with the controllers 702 through the communications network 706. The controllers 702 are programmed to execute software 704, such as programs and/or other software applications, and access applications managed by servers 708.

In the embodiments described below, users may respectively operate the controllers 702 that may be connected to the servers 708 over the communications network 706. Pages, images, data, documents, and the like may be displayed to a user via the controllers 702. Information and images may be displayed through a display device and/or a graphical user interface in communication with the controller 702.

It is noted that the controller 702 may be a personal computer, laptop mobile computing device, smart phone, video game console, home digital media player, network-connected television, set top box, and/or other computing devices having components suitable for communicating with the communications network 706 and/or the necessary applications or software. The controller 702 may also execute other software applications configured to receive content and information from the data path application 712.

Figure 7:
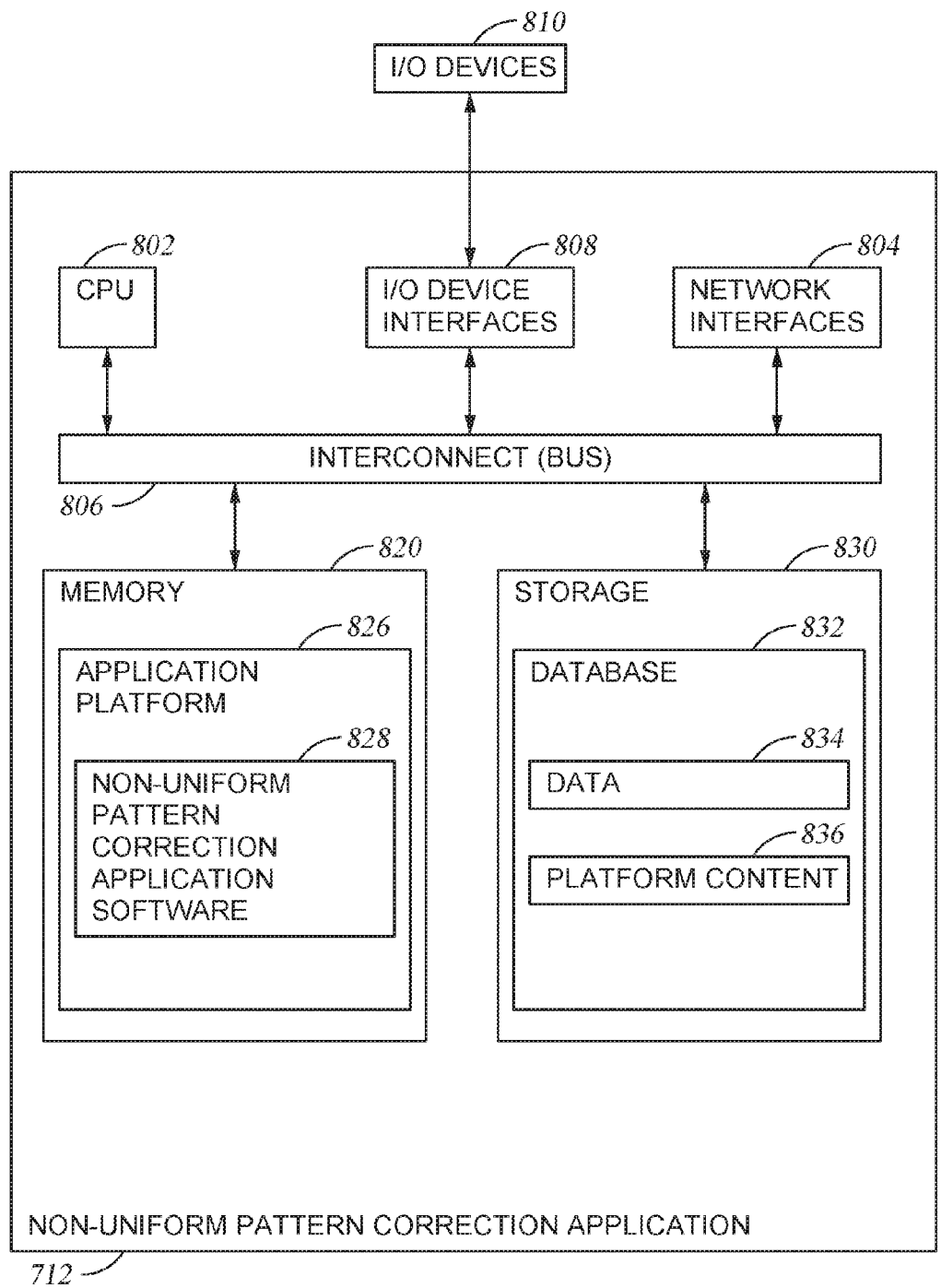
FIG. 7 illustrates a more detailed view of a server of FIG. 6 according to one embodiment.

FIG. 7 illustrates a more detailed view of the non-uniform pattern correction application server 712 of FIG. 6. The non-uniform pattern correction application server 712 includes, without limitation, a central processing unit (CPU) 802, a network interface 804, memory 820, and storage 830 communicating via an interconnect 806. The non-uniform pattern correction application server 712 may also include I/O device interfaces 808 connecting I/O devices 810 (for example, keyboard, video, mouse, audio, touchscreen, etc.). The non-uniform pattern correction application server 712 may further include the network interface 804 configured to transmit data via the communications network 706.

The CPU 802 retrieves and executes programming instructions stored in the memory 820 and generally controls and coordinates operations of other system components. Similarly, the CPU 802 stores and retrieves application data residing in the memory 820. The CPU 802 is included to be representative of a single CPU, multiple CPU's, a single CPU having multiple processing cores, and the like. The interconnect 806 is used to transmit programming instructions and application data between the CPU 802, I/O device interfaces 808, storage 830, network interfaces 804, and memory 820.

The memory 820 is generally included to be representative of a random access memory and, in operation, stores software applications and data for use by the CPU 802. Although shown as a single unit, the storage 830 may be a combination of fixed and/or removable storage devices, such as fixed disk drives, floppy disk drives, hard disk drives, flash memory storage drives, tape drives, removable memory cards, CD-ROM, DVD-ROM, Blu-Ray, HD-DVD, optical storage, network attached storage (NAS), cloud storage, or a storage area-network (SAN) configured to store non-volatile data.

The memory 820 may store instructions and logic for executing an application platform 826 which may include non-uniform pattern correction application software 828. The storage 830 may include a database 832 configured to store data 834 and associated application platform content 836. The database 832 may be any type of storage device.

Network computers are another type of computer system that can be used in conjunction with the disclosures provided herein. Network computers do not usually include a hard disk or other mass storage, and the executable programs are loaded from a network connection into the memory 820 for execution by the CPU 802. A typical computer system will usually include at least a processor, memory, and an interconnect coupling the memory to the processor.

Figure 8:
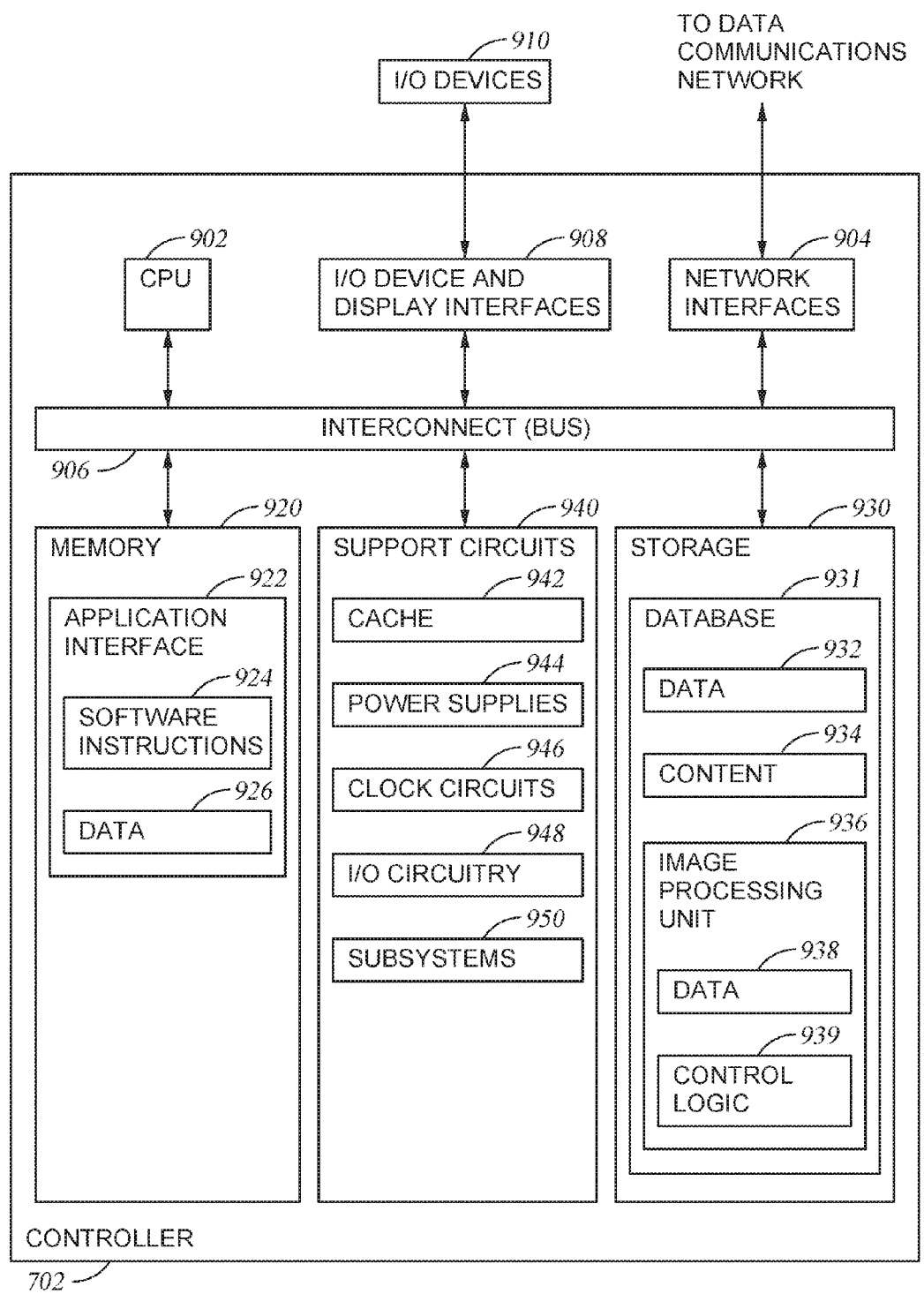
FIG. 8 illustrates a controller computing system used to access a non-uniform pattern correction application according to one embodiment.

FIG. 8 illustrates a controller 702 used to access the non-uniform pattern correction application 712 and retrieve or display data associated with the application platform 826. The controller 702 may include, without limitation, a central processing unit (CPU) 902, a network interface 904, an interconnect 906, a memory 920, storage 930, and support circuits 940. The controller 702 may also include an I/O device interface 908 connecting I/O devices 910 (for example, keyboard, display, touchscreen, and mouse devices) to the controller 702.

Like CPU 802, CPU 902 is included to be representative of a single CPU, multiple CPU's, a single CPU having multiple processing cores, etc., and the memory 920 is generally included to be representative of a random access memory. The interconnect 906 may be used to transmit programming instructions and application data between the CPU 902, I/O device interfaces 908, storage 930, network interface 904, and memory 920. The network interface 904 may be configured to transmit data via the communications network 706, for example, to transfer content from the non-uniform pattern correction application server 712. Storage 930, such as a hard disk drive or solid-state storage drive (SSD), may store non-volatile data. The storage 930 may contain a database 931. The database 931 may contain data 932 and other content 934. Illustratively, the memory 920 may include an application interface 922, which itself may display software instructions 924, and/or store or display data 926. The application interface 922 may provide one or more software applications which allow the controller to access data and other content hosted by the data path application server 712.

As shown in FIG. 8, the system 100 includes a controller 702. The controller 702 is generally designed to facilitate the control and automation of the processing techniques described herein. The controller 702 may be coupled to or in communication with one or more of the processing apparatus 160, the stages 130, and the encoder 126. The processing apparatus 160 and the stages 130 may provide information to the controller 702 regarding the substrate processing and the substrate aligning. For example, the processing apparatus 160 may provide information to the controller 702 to alert the controller that substrate processing has been completed. The encoder 126 may provide location information to the controller 702, and the location information is then used to control the stages 130 and the processing apparatus 160.

The controller 702 may include a central processing unit (CPU) 902, memory 920, and support circuits 940 (or I/O 908). The CPU 902 may be one of any form of computer processors that are used in industrial settings for controlling various processes and hardware (e.g., pattern generators, motors, and other hardware) and monitor the processes (e.g., processing time and substrate position). The memory 920, as shown in FIG. 8, is connected to the CPU 902, and may be one or more of a readily available memory, such as random access memory (RAM), read only memory (ROM), floppy disk, hard disk, or any other form of digital storage, local or remote. Software instructions and data can be coded and stored within the memory for instructing the CPU 902. The support circuits 940 are also connected to the CPU 902 for supporting the processor in a conventional manner. The support circuits 940 may include conventional cache 942, power supplies 944, clock circuits 946, input/output circuitry 948, subsystems 950, and the like. A program (or computer instructions) readable by the controller 702 determines which tasks are performable on a substrate. The program may be software readable by the controller 702 and may include code to monitor and control, for example, the processing time and substrate position.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

The present example also relates to an apparatus for performing the operations herein. This apparatus may be specially constructed for the necessary purposes, or it may comprise a general purpose computer selectively activated or reconfigured by a computer program stored in the computer. Such a computer program may be stored in a computer readable storage medium, such as, but is not limited to, read-only memories (ROMs), random access memories (RAMs), EPROMs, EEPROMs, flash memory, magnetic or optical cards, any type of disk including floppy disks, optical disks, CD-ROMs, and magnetic-optical disks, or any type of media suitable for storing electronic instructions, and each coupled to a computer system interconnect.

The algorithms and displays presented herein are not inherently related to any particular computer or other apparatus. Various general purpose systems may be used with programs in accordance with the teachings herein, or it may prove convenient to construct a more specialized apparatus to perform the necessary method operations. The structure for a variety of these systems will appear from the description above. In addition, the present examples are not described with reference to any particular programming language, and various examples may thus be implemented using a variety of programming languages.

As described in greater detail within, embodiments of the disclosure provide a software application platform which maintains the ability to correct non-uniform image patterns using time-shifted exposures of a substrate in a manufacturing process. The application exposes subsequent portions of a substrate to electromagnetic radiation at variable and alternating pulse frequencies using a time delay in order to correct interference patterns and increase exposure uniformity.

Figure 9A:
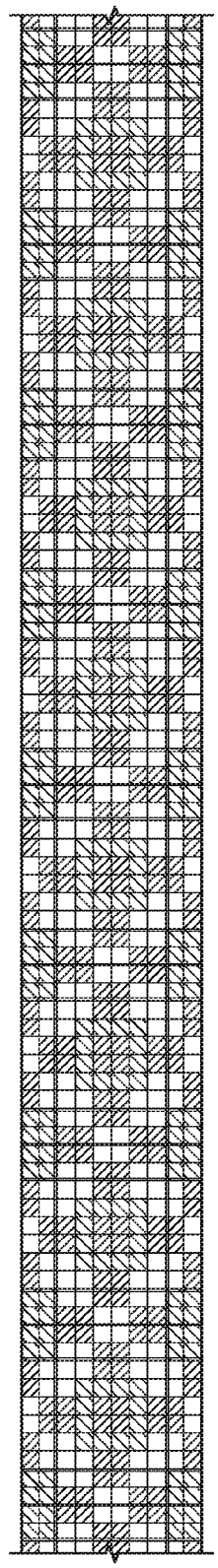
FIG. 9A illustrates a top view of a single exposure of the substrate according to one embodiment.
Figure 9B:
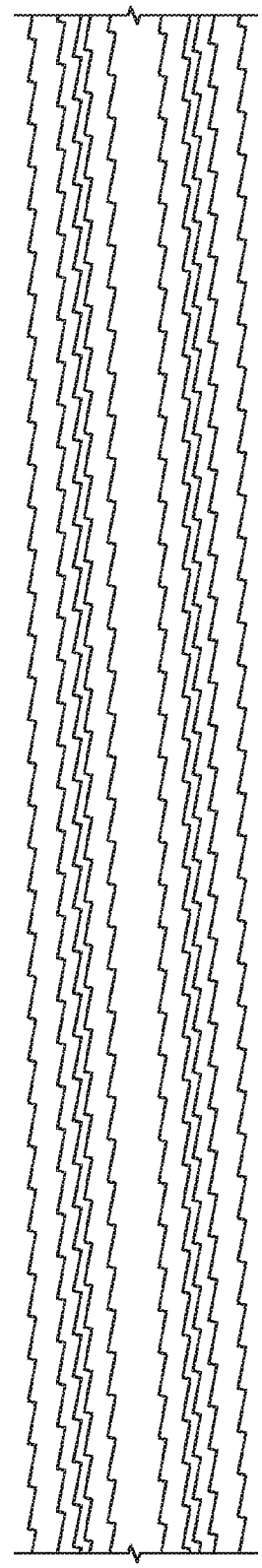
FIG. 9B illustrates a top view of a non-uniform combination of multiple single exposures of the substrate according to one embodiment.
Figure 9C:
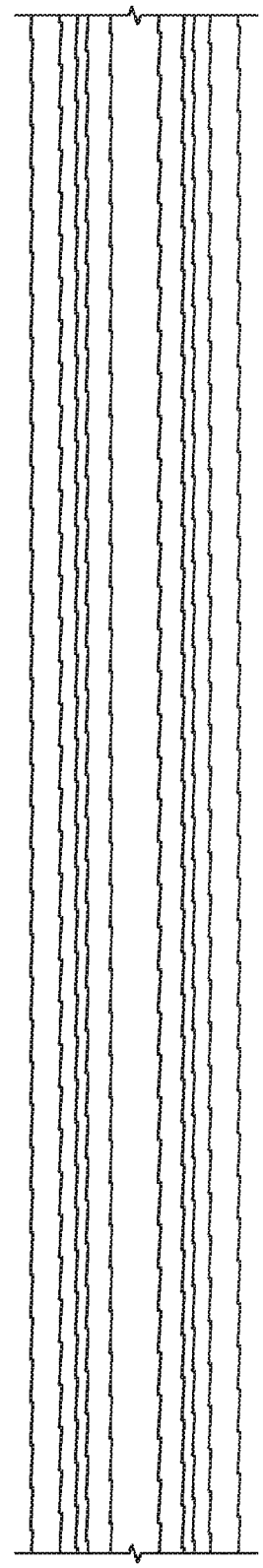
FIG. 9C illustrates a top view of a uniform combination of the multiple single exposures of FIG. 9B with the non-uniform pattern correction application applied according to one embodiment.

Processing each data set may allow for the correcting of imperfections in the exposure or patterns. FIG. 9A illustrates a top view of a plurality of exposures from any single line of individual DMDs 410 exposure of the substrate 140 to light. As shown in FIG. 9A a single row of DMDs 410 has exposed a corresponding section of the substrate 140 to light to form the image of FIG. 9A. Subsequently, the substrate 140 may continue to move across the stage 130. As the substrate 140 continues to move, each DMD 410 may continue to expose proximate areas of the substrate 140, thus accumulating exposures. FIG. 9B illustrates the accumulated exposures of FIG. 9A utilizing a standard single frequency pulse. As shown in FIG. 9B, the accumulated exposures, once combined, may form a diagonal swath of data set points which repeat individual DMD 410 exposures. The diagonal swath of data set point may create a non-uniform scalloped or rope-like image as illustrated in FIG. 9B. As shown in FIG. 9C, shifting the exposures with the use of the time delay of the non-uniform pattern correction application 712 and applying a dual frequency exposure may rearrange and/or reposition the individual exposure data set points. The application of the non-uniform pattern correction application 712 may result in a more uniform exposure of the substrate 140. More uniform exposures of the substrate 140 may lead to reduced and/or minimal line edge roughness. Comparatively, the exposures of FIG. 9C have a lower line edge roughness than the exposures of FIG. 9B.

In one embodiment, a method for correcting non-uniform image patterns on a substrate is disclosed. The method may be performed by a controller 702, as shown in FIG. 8.

As discussed with reference to FIG. 3, supra, each image projection system 301 produces a plurality of write beams 302 onto a surface 304 of the substrate 140, and, as the substrate 140 moves in the X-direction and Y-direction, the entire surface 304 may be patterned by the write beams 302. During patterning the controller may direct one or more image projection systems 301 to scan a portion of one or more graphical objects of the surface 304 of the substrate 140. Scans may be completed by an optical unit or image projection system 301. Each scan may expose the substrate 140. Additionally, processing of the information scanned by the image projection systems 301 may occur. During patterning, a first portion of the substrate 140 may be exposed to a first pulse set of electromagnetic radiation. Exposing the substrate may form a pattern on the substrate to expose a photo-resist of the substrate. In one embodiment the image projection system 301 may produce the electromagnetic radiation. The electromagnetic radiation may be visible light, for example, blue laser light emitted from the image projection system 301 and reflected off of the DMD 410. In one embodiment, the image projection system 301 may expose a substrate and deliver light to the surface of the substrate 140. Each exposure may last between approximately about 45 microseconds and about 85 microseconds, for example between about 55 microseconds and about 75 microseconds.

The first pulse set of electromagnetic radiation may include a first pulse exposure and a second pulse exposure. Each exposure may generate a data set relating to graphical objects patterned on the substrate 140. Each data set may be stored in the memory 920 of the controller. Each data set may be combined to form the image pattern on the substrate 140. Each exposure may form an aerial image of a portion of the substrate 140. The first pulse exposure and the second pulse exposure may be separated in time by a first time interval. During patterning, a second portion of the substrate 140 may be exposed to a second pulse set of electromagnetic radiation. The second pulse set of electromagnetic radiation may include a third pulse exposure and a fourth pulse exposure. The third pulse exposure and the fourth pulse exposure may be separated in time by between about +30% and about −30% of the first time interval. In some embodiments, the range of time between the third pulse exposure and the fourth pulse exposure may be selected and/or determined randomly between about −30% of the first time interval and about +30% of the first time interval. The first pulse set of electromagnetic radiation and the second pulse set of electromagnetic radiation may be separated in time by a second time interval. The second time interval may be different that the first time interval, thus creating a dual-pulsed exposure.

In some embodiments, however, random—or pseudo-random—number generation for a syncopated shot rhythm may be provided for regardless of the syncopation period. As such, the first time interval and/or the second time interval may be randomly generated and/or aperiodic.

Additionally, in some embodiments, the first pulse set may also include a fifth pulse exposure after the second pulse exposure. The second pulse exposure and the fifth pulse exposure may be separated in time by a third time interval. In some embodiments, the third time interval may be the same as the first time interval, and/or between about +30% and about −30% of the first time interval. In other embodiments, the third time interval may be different than the first time interval. Also, in some embodiments, the first time interval and/or the second time interval may be randomly generated, as discussed supra. In other embodiments, the first time interval, the second time interval, and/or the third time interval may be randomly generated, as discussed supra.

In another embodiment, a computer system for correcting non-uniform image patterns on a substrate is disclosed. The computer system may comprise a processor and a memory. The memory may store instructions that, when executed by the processor, cause the computer system to expose a first portion of the substrate 140 to a first pulse set of electromagnetic radiation, and expose a second portion of the substrate to a second pulse set of electromagnetic radiation. The first pulse set may include a first pulse exposure and a second pulse exposure. The first pulse exposure and the second pulse exposure may be separated in time by a first time interval. The second pulse set may include a third pulse exposure and a fourth pulse exposure. The third pulse exposure and the fourth pulse exposure may be separated in time by between about +30% and about −30% of the first time interval. In some embodiments, the range of time between the third pulse exposure and the fourth pulse exposure may be selected and/or determined randomly between about −30% of the first time interval and about +30% of the first time interval. The first pulse set of electromagnetic radiation and the second pulse set of electromagnetic radiation may be separated in time by a second time interval. The second time interval may be different that the first time interval. In some embodiments, however, random—or pseudo-random—number generation for a syncopated shot rhythm may be provided for regardless of the syncopation period. As such, the first time interval and/or the second time interval may be randomly generated and/or aperiodic.

Additionally, in some embodiments, the first pulse set may also include a fifth pulse exposure after the second pulse exposure. The second pulse exposure and the fifth pulse exposure may be separated in time by a third time interval. In some embodiments, the third time interval may be the same as the first time interval, and/or between about +30% and about −30% of the first time interval. In other embodiments, the third time interval may be different than the first time interval. Also, in some embodiments, the first time interval and/or the second time interval may be randomly generated, as discussed supra. In other embodiments, the first time interval, the second time interval, and/or the third time interval may be randomly generated, as discussed supra.

In yet another embodiment, a non-transitory computer-readable storage medium, storing instructions that, when executed by a processor, cause a computer system to correct non-uniform image patterns on a substrate is disclosed. The processor may perform the steps of exposing a first portion of a substrate to a first pulse set of electromagnetic radiation and exposing a second portion of the substrate to a second pulse set of electromagnetic radiation. The first pulse set may include a first pulse exposure and a second pulse exposure. The first pulse exposure and the second pulse exposure may be separated in time by a first time interval. The second pulse set may include a third pulse exposure and a fourth pulse exposure. The third pulse exposure and the fourth pulse exposure may be separated in time by between about +30% and about −30% of the first time interval. In some embodiments, the range of time between the third pulse exposure and the fourth pulse exposure may be selected and/or determined randomly between about −30% of the first time interval and about +30% of the first time interval. The first pulse set of electromagnetic radiation and the second pulse set of electromagnetic radiation may be separated in time by a second time interval that is different than the first time interval. In some embodiments, however, random—or pseudo-random—number generation for a syncopated shot rhythm may be provided for regardless of the syncopation period. As such, the first time interval and/or the second time interval may be randomly generated and/or aperiodic.

Additionally, in some embodiments, the first pulse set may also include a fifth pulse exposure after the second pulse exposure. The second pulse exposure and the fifth pulse exposure may be separated in time by a third time interval. In some embodiments, the third time interval may be the same as the first time interval, and/or between about +30% and about −30% of the first time interval. In other embodiments, the third time interval may be different than the first time interval. Also, in some embodiments, the first time interval and/or the second time interval may be randomly generated, as discussed supra. In other embodiments, the first time interval, the second time interval, and/or the third time interval may be randomly generated, as discussed supra.

The first time interval and the second time interval may create a dual frequency rate at which the substrate 140 is exposed. By way of example only, and not intended to be limiting, the dual frequency may change the pulsing to expose the substrate 140 at alternating frequencies such as a two-step rhythm occurring at 19.88 μm and 19.26 μm rather than a single-step rhythm occurring every 19.57 μm. The mean of the two-step rhythm of the alternating frequencies may be equivalent to the mean of single-step rhythm of the single frequency.

In one embodiment, the substrate 140 is moving on the stage 130 and along the track 124 during processing. When the second time interval is greater than the first time interval the substrate may move a greater distance along the track 124 during the second time interval than during the first time interval. However, in certain embodiments the first time interval may be greater than the second time interval. In this embodiment, the substrate may move a greater distance along the track 124 during the first time interval than during the second time interval.

In certain embodiments, a third portion of the substrate 140 may be exposed to a third pulse of electromagnetic radiation. The third pulse set may include a fifth pulse exposure and a sixth pulse exposure. The fifth pulse exposure and the sixth pulse exposure may be separated in time by between about +30% and about −30% of the first time interval. In some embodiments, the range of time between the third pulse exposure and the fourth pulse exposure may be selected and/or determined randomly between about −30% of the first time interval and about +30% of the first time interval. The first pulse set of electromagnetic radiation, the second pulse set of electromagnetic radiation, and the third pulse set of electromagnetic radiation may be separated in time by the second time interval. The second time interval may be different than the first time interval. It should be noted that any number of pulse exposures of electromagnetic radiation greater than at least two pulse exposures may be suitable to expose and/or pattern the substrate. As such, the mean of the three-step rhythm of the alternating frequencies may be equivalent to the mean of the single-step rhythm of the single frequency.

The image projection system 301, supra, may expose the substrate and deliver light to the surface of the substrate 140. Each exposure may last between approximately about 30 microseconds and about 95 microseconds, for example between about 45 microseconds and about 75 microseconds, such as about 65 microseconds. The image data generated from the image processing unit 936 may further be stored in the image processing unit 936 or in another suitable storage facility. A complete image may be produced within one imaging time. The image processing unit 936 may contain data 938 and/or control logic 939 configured to correct non-uniform image patterns on a substrate using time-shifted exposures. The control logic 939 of the image processing unit 936 may be configured to expose subsequent portions of a substrate to electromagnetic radiation at variable and alternating pulse frequencies using a time delay in order to correct interference patterns and increase exposure uniformity. The image projection system 301, supra, may expose the substrate and deliver light to the surface of the substrate 140.

The exposing of each subsequent portion of the substrate 140 may be repeated until the substrate 140 is fully exposed and processed through the system 100.

Furthermore, it is also contemplated that additional variations of the shot pattern may be had, by way of example only, a triple-beat. As such, in some embodiments, shots, pulse exposures, and/or pulse sets may be evenly distributed over time. In other embodiments, however, shots, pulse exposures, and/or pulse sets may not be evenly distributed over time.

FIG. 10 schematically illustrates operations of a method 1000 for correcting non-uniform image patterns on a substrate according to one embodiment described herein. The method 1000 generally relates to exposing subsequent portions of a substrate to electromagnetic radiation at variable and alternating pulse frequencies using a time delay in order to correct interference patterns and increase exposure uniformity. At operation 1010, a first portion of the substrate is exposed to a first pulse of set of electromagnetic radiation. The first pulse set may include a first pulse exposure and a second pulse exposure. The first pulse exposure and the second pulse exposure may be separated in time by a first time interval. At operation 1020, a second portion of the substrate may be exposed to a second pulse set of electromagnetic radiation. The second pulse set may include a third pulse exposure and a fourth pulse exposure. The third pulse exposure and the fourth pulse exposure may be separated in time by between about +30% and −30% of the first time interval. In some embodiments, the range of time between the third pulse exposure and the fourth pulse exposure may be selected and/or determined randomly between about −30% of the first time interval and about +30% of the first time interval. The first pulse set of electromagnetic radiation and the second pulse set of electromagnetic radiation may be separated in time by a second time interval. The second time interval may be different than the first time interval.

Testing was completed and results yielded a 66% improvement in line edge roughness when utilizing dual frequency pulsing versus the utilization of standard single frequency pulsing. In tests comparing single frequency pulsing to dual frequency pulsing, a line edge roughness of 6.8% was measured during the utilization of standard single frequency pulsing, while a line edge roughness of 2.6% was measured during the utilization of dual frequency pulsing.

Benefits of the embodiments disclosed herein may include the correction of line edge roughness ("LER") exposure defects through the use of a software setting. Undesirable line edge roughness may be created due to the misalignment of the substrate on the stage, or by vibration of the stage while the substrate is being processed thereon. Additionally, multi-frequency pulsing may enable processing uniformity of the substrate at lower exposure multiples thus increasing throughput and improving half-tone performance. Additionally, a DMD 410 may malfunction causing exposure defects, however the utilization of the non-uniform pattern correction application may fix a malfunction instantaneously via a software setting.

The application described herein maintains the ability to correct non-uniform image patterns using time-shifted exposures of a substrate in a manufacturing process. The application exposes subsequent portions of a substrate to electromagnetic radiation at variable and alternating pulse frequencies using a time delay in order to correct interference patterns and increase exposure uniformity.

While the foregoing is directed to embodiments described herein, other and further embodiments may be devised without departing from the basic scope thereof. For example, aspects of the present disclosure may be implemented in hardware or software or in a combination of hardware and software. One embodiment described herein may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (for example, read-only memory devices within a computer such as CD-ROM disks readable by a CD-ROM drive, flash memory, ROM chips or any type of solid-state non-volatile semiconductor memory) on which information is permanently stored; and (ii) writable storage media (for example, floppy disks within a diskette drive or hard-disk drive or any type of solid-state random-access semiconductor memory) on which alterable information is stored. Such computer-readable storage media, when carrying computer-readable instructions that direct the functions of the disclosed embodiments, are embodiments of the present disclosure.

It will be appreciated to those skilled in the art that the preceding examples are exemplary and not limiting. It is intended that all permutations, enhancements, equivalents, and improvements thereto that are apparent to those skilled in the art upon a reading of the specification and a study of the drawings are included within the true spirit and scope of the present disclosure. It is therefore intended that the following appended claims include all such modifications, permutations, and equivalents as fall within the true spirit and scope of these teachings.

What is claimed is:

1. A method for correcting non-uniform image patterns on a substrate, comprising:
    (a) exposing a first portion of the substrate to a first pulse set of electromagnetic radiation, wherein the first pulse set includes a first pulse exposure and a second pulse exposure, wherein the first pulse exposure and the second pulse exposure are separated in time by a first time interval; and
    (b) exposing a second portion of the substrate to a second pulse set of electromagnetic radiation, wherein the second pulse set includes a third pulse exposure and a fourth pulse exposure, wherein the third pulse exposure and the fourth pulse exposure are separated in time by between about +30% and about −30% of the first time interval, and wherein the first pulse set of electromagnetic radiation and the second pulse set of electromagnetic radiation are separated in time by a second time interval that is different than the first time interval.

2. The method of claim 1, further comprising repeating (a)-(b).

3. The method of claim 1, wherein the exposing forms a pattern on the substrate to expose a photo-resist.

4. The method of claim 1, wherein the first pulse set further includes a fifth pulse exposure after the second pulse exposure, and wherein the second pulse exposure and the fifth pulse exposure are separated in time by a third time interval.

5. The method of claim 4, wherein the third time interval is between about plus or minus 30% of the first time interval.

6. The method of claim 4, wherein the third time interval is different than the first time interval.

7. The method of claim 4, wherein the first time interval, the second time interval, and the third time interval are randomly generated.

8. The method of claim 1, wherein the first time interval and the second time interval are randomly generated.

9. The method of claim 1, further comprising:
(c) exposing a third portion of the substrate to a third pulse set of electromagnetic radiation, wherein the third pulse set includes a fifth pulse exposure and a sixth pulse exposure, wherein the fifth pulse exposure and the sixth pulse exposure are separated in time by between about +30% and about −30% of the first time interval, and wherein the first pulse set of electromagnetic radiation, the second pulse set of electromagnetic radiation, and the third pulse set of electromagnetic radiation are separated in time by the second time interval.

10. The method of claim 1, wherein each exposure generates a data set, wherein each data set is stored in a memory, and wherein each data set is combined to form the image pattern.

11. The method of claim 1, wherein the first time interval is shorter than the second time interval.

12. The method of claim 1, wherein the exposing is performed by at least one image projection system.

13. A computer system for correcting non-uniform image patterns on a substrate, comprising:
a processor; and
a memory storing instructions that, when executed by the processor, cause the computer system to:
(a) expose a first portion of the substrate to a first pulse set of electromagnetic radiation, wherein the first pulse set includes a first pulse exposure and a second pulse exposure, wherein the first pulse exposure and the second pulse exposure are separated in time by a first time interval; and
(b) expose a second portion of the substrate to a second pulse set of electromagnetic radiation, wherein the second pulse set includes a third pulse exposure and a fourth pulse exposure, wherein the third pulse exposure and the fourth pulse exposure are separated in time by between about +30% and about −30% of the first time interval, and wherein the first pulse set of electromagnetic radiation and the second pulse set of electromagnetic radiation are separated in time by a second time interval that is different than the first time interval.

14. The computer system of claim 13, further comprising repeating (a)-(b).

15. The computer system of claim 13, wherein the exposing forms a pattern on the substrate to expose a photo-resist.

16. The computer system of claim 13, wherein the first pulse set further includes a fifth pulse exposure after the second pulse exposure, and wherein the second pulse exposure and the fifth pulse exposure are separated in time by a third time interval.

17. The computer system of claim 16, wherein the third time interval is the same as the first time interval.

18. The computer system of claim 16, wherein the third time interval is different than the first time interval.

19. The computer system of claim 16, wherein the first time interval, the second time interval, and the third time interval are randomly generated.

20. The computer system of claim 13, wherein the first time interval and the second time interval are randomly generated.

21. The computer system of claim 13, further comprising:
(c) exposing a third portion of the substrate to a third pulse set of electromagnetic radiation, wherein the third pulse set includes a fifth pulse exposure and a sixth pulse exposure, wherein the fifth pulse exposure and the sixth pulse exposure are separated in time by between about +30% and about −30% of the first time interval, and wherein the first pulse set of electromagnetic radiation, the second pulse set of electromagnetic radiation, and the third pulse set of electromagnetic radiation are separated in time by the second time interval.

22. The computer system of claim 13, wherein each exposure generates a data set, wherein each data set is stored in the memory, and wherein each data set is combined to form the image pattern.

23. The computer system of claim 13, wherein the first time interval is shorter than the second time interval.

24. The computer system of claim 13, wherein the exposing is performed by at least one image projection system.

25. A non-transitory computer-readable medium storing instructions that, when executed by a processor, cause a computer system to correct non-uniform image patterns on a substrate, by performing:
(a) exposing a first portion of the substrate to a first pulse set of electromagnetic radiation, wherein the first pulse set includes a first pulse exposure and a second pulse exposure, wherein the first pulse exposure and the second pulse exposure are separated in time by a first time interval; and
(b) exposing a second portion of the substrate to a second pulse set of electromagnetic radiation, wherein the second pulse set includes a third pulse exposure and a fourth pulse exposure, wherein the third pulse exposure and the fourth pulse exposure are separated in time by between about +30% and about −30% of the first time interval, and wherein the first pulse set of electromagnetic radiation and the second pulse set of electromagnetic radiation are separated in time by a second time interval that is different than the first time interval.

26. The non-transitory computer-readable medium of claim 25, further comprising repeating (a)-(b).

27. The non-transitory computer-readable medium of claim 25, wherein the exposing is performed by at least one image projection system to form a pattern on the substrate to expose a photo-resist.

28. The non-transitory computer-readable medium of claim 25, wherein the first pulse set further includes a fifth pulse exposure after the second pulse exposure, and wherein the second pulse exposure and the fifth pulse exposure are separated in time by a third time interval.

29. The non-transitory computer-readable medium of claim 28, wherein the third time interval is the same as the first time interval.

30. The non-transitory computer-readable medium of claim 28, wherein the third time interval is different than the first time interval.

31. The non-transitory computer-readable medium of claim 25, further comprising:
(c) exposing a third portion of the substrate to a third pulse set of electromagnetic radiation, wherein the third pulse set includes a fifth pulse exposure and a sixth pulse exposure, wherein the fifth pulse exposure and the sixth pulse exposure are separated in time by between about +30% and about −30% of the first time interval, and wherein the first pulse set of electromagnetic radiation, the second pulse set of electromagnetic radiation, and the third pulse set of electromagnetic radiation are separated in time by the second time interval.

32. The non-transitory computer-readable medium of claim 25, wherein each exposure generates a data set, wherein each data set is stored in a memory, and wherein each data set is combined to form the image pattern.

33. The non-transitory computer-readable medium of claim 25, wherein the first time interval is shorter than the second time interval.

* * * * *

UNITED STATES PATENT AND TRADEMARK OFFICE
CERTIFICATE OF CORRECTION

PATENT NO. : 9,823,573 B2  
APPLICATION NO. : 15/188667  
DATED : November 21, 2017  
INVENTOR(S) : Joseph R. Johnson et al.

Page 1 of 1

It is certified that error appears in the above-identified patent and that said Letters Patent is hereby corrected as shown below:

On the Title Page

In item (60), in Column 1, in "Related U.S. Application Data", Line 1, delete "61/188,303," and insert -- 62/188,303, --, therefor.

Signed and Sealed this  
Twenty-second Day of May, 2018

Andrei Iancu  
*Director of the United States Patent and Trademark Office*